United States Patent
Arai et al.

(10) Patent No.: US 7,298,006 B2
(45) Date of Patent: *Nov. 20, 2007

(54) NONVOLATILE SEMICONDUCTOR MEMORY DEVICE INCLUDING IMPROVED GATE ELECTRODE

(75) Inventors: Fumitaka Arai, Yokohama (JP); Yasuhiko Matsunaga, Kawasaki (JP); Makoto Sakuma, Yokohama (JP); Riichiro Shirota, Fujisawa (JP); Akira Shimizu, Oyama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/535,514

(22) Filed: Sep. 27, 2006

(65) Prior Publication Data

US 2007/0018235 A1    Jan. 25, 2007

Related U.S. Application Data

(62) Division of application No. 11/118,478, filed on May 2, 2005, now Pat. No. 7,122,858, which is a division of application No. 10/648,510, filed on Aug. 27, 2003, now Pat. No. 7,078,763.

(30) Foreign Application Priority Data

Feb. 26, 2003   (JP)   .............. 2003-049615

(51) Int. Cl.
*H01L 29/788* (2006.01)
(52) U.S. Cl. .............. 257/320; 257/316; 257/319; 257/330; 257/E29.26
(58) Field of Classification Search ............ 257/320

See application file for complete search history.

(56) References Cited

U.S. PATENT DOCUMENTS

| 5,736,443 | A | 4/1998 | Park et al. |
| 6,159,796 | A | 12/2000 | Dietz et al. |
| 6,326,661 | B1 | 12/2001 | Dormans et al. |
| 6,373,095 | B1 | 4/2002 | Bracchitta et al. |
| 6,403,494 | B1 | 6/2002 | Chu et al. |
| 6,567,315 | B2 | 5/2003 | Takase et al. |
| 6,642,103 | B2 | 11/2003 | Wils et al. |
| 6,835,978 | B2 | 12/2004 | Matsui et al. |
| 6,878,985 | B2 | 4/2005 | Arai et al. |

(Continued)

FOREIGN PATENT DOCUMENTS

JP   64-73771   3/1989

(Continued)

OTHER PUBLICATIONS

Y. Sasago, et al., 10 MB/s Multi-Level Programming of Gb-Scale Flash Memory Enabled by New AG-AND Cell Technology 2002 IEEE, pp. 952-954 IEDM, 21.6.1.

(Continued)

*Primary Examiner*—Tu-Tu Ho
(74) *Attorney, Agent, or Firm*—Oblon, Spivak, McClelland, Maier & Neustadt, P.C.

(57) ABSTRACT

A floating gate is formed on a semiconductor substrate via a gate insulating film. Diffused layers are formed as sources or drain regions on opposite sides of the floating gate in the semiconductor substrate. First and second control gates are formed opposite to both of the diffused layers on the opposite sides of the floating gate via an inter-gate insulating film to drive the floating gate.

15 Claims, 15 Drawing Sheets

U.S. PATENT DOCUMENTS

| | | |
|---|---|---|
| 6,888,755 B2 * | 5/2005 | Harari ............... 365/185.18 |
| 6,921,960 B2 | 7/2005 | Ichige et al. |
| 7,020,025 B2 | 3/2006 | Sato et al. |
| 7,026,684 B2 | 4/2006 | Sakuma et al. |
| 7,071,511 B2 | 7/2006 | Sakuma et al. |
| 2003/0030123 A1 | 2/2003 | Ichige et al. |
| 2004/0165443 A1 | 8/2004 | Harari |

FOREIGN PATENT DOCUMENTS

| | | |
|---|---|---|
| JP | 3-108771 | 5/1991 |
| JP | 4-253375 | 9/1992 |
| JP | 11-145429 | 5/1999 |
| JP | 3073352 | 6/2000 |
| JP | 2000-223676 | 8/2000 |
| JP | 3147108 | 1/2001 |
| JP | 2002-26151 | 1/2002 |
| JP | 2002-50703 | 2/2002 |
| JP | 2002-217318 | 8/2002 |
| KR | 2000-0053531 | 8/2000 |

OTHER PUBLICATIONS

U.S. Appl. No. 07/244,854, filed Sep. 15, 1988, Unknown.
U.S. Appl. No. 11/535,514, filed Sep. 27, 2006, Arai et al.
U.s. Appl. No. 11/616,522, filed Dec. 27, 2006, Arai et al.

* cited by examiner

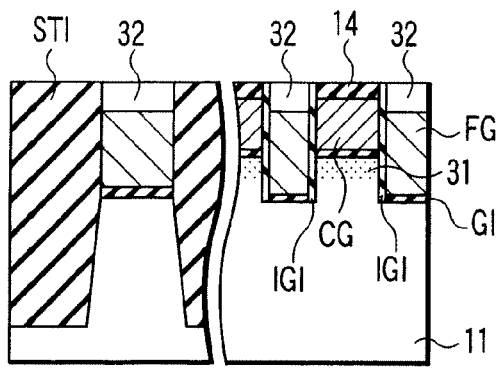
F I G. 10A
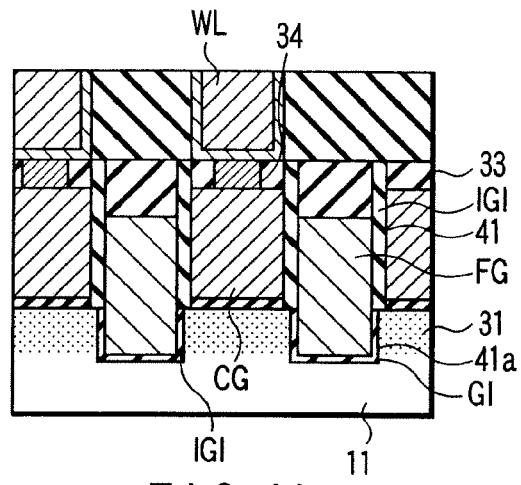
F I G. 11
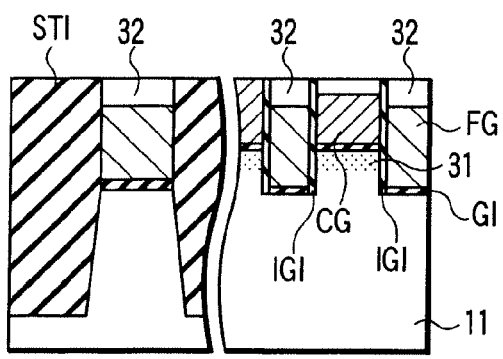
F I G. 10B
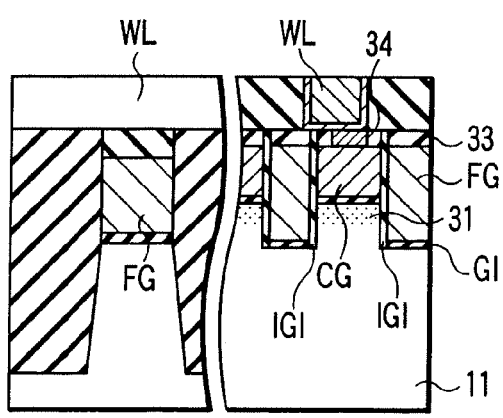
F I G. 10C
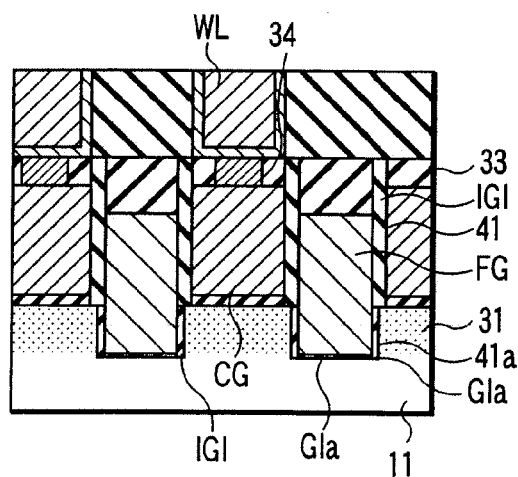
F I G. 12

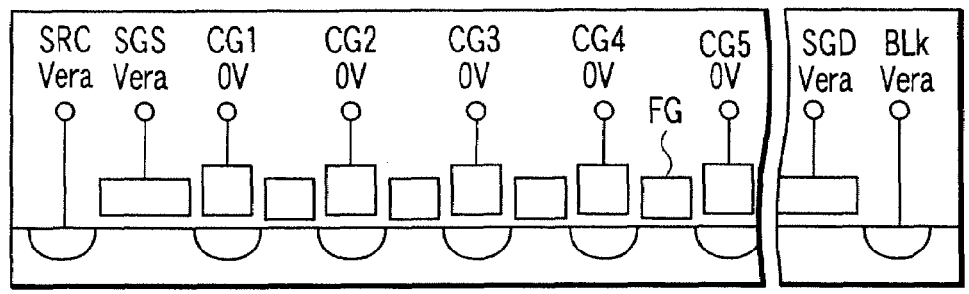
F I G. 20
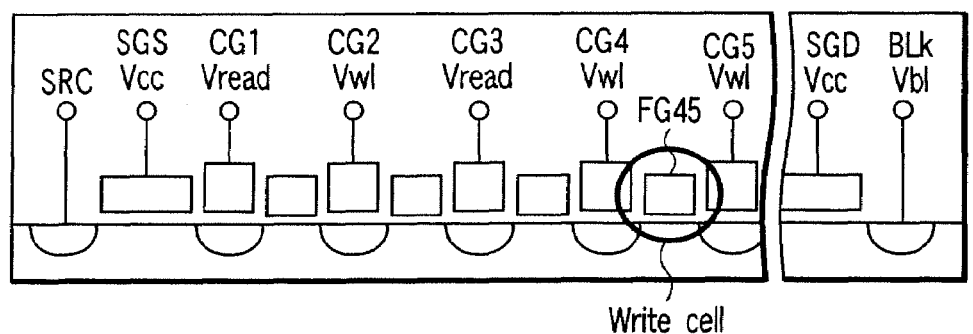
F I G. 21
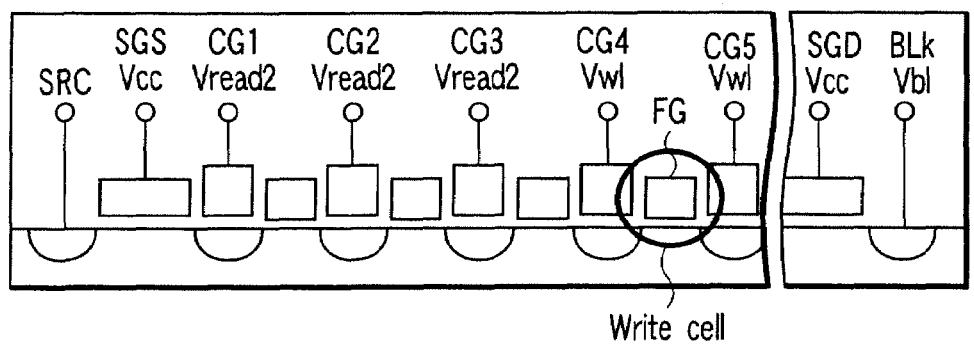
F I G. 22

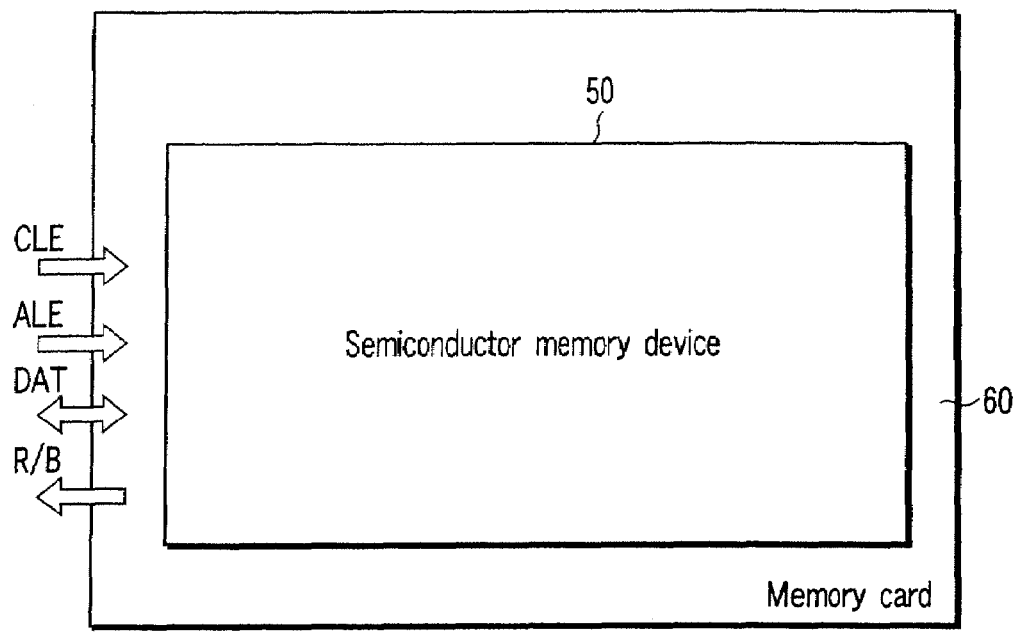
F I G. 27
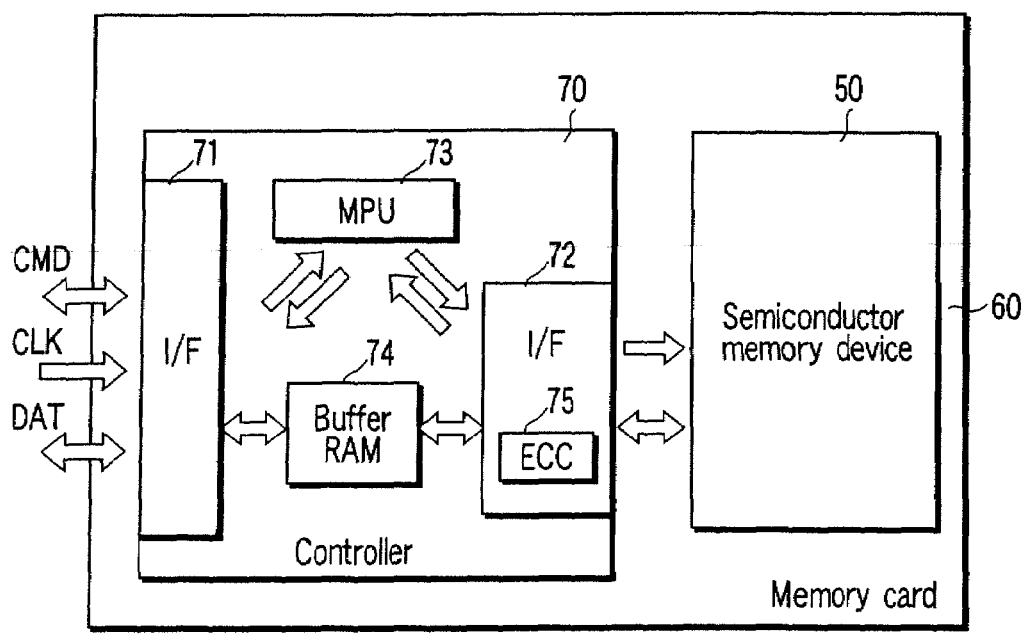
F I G. 28

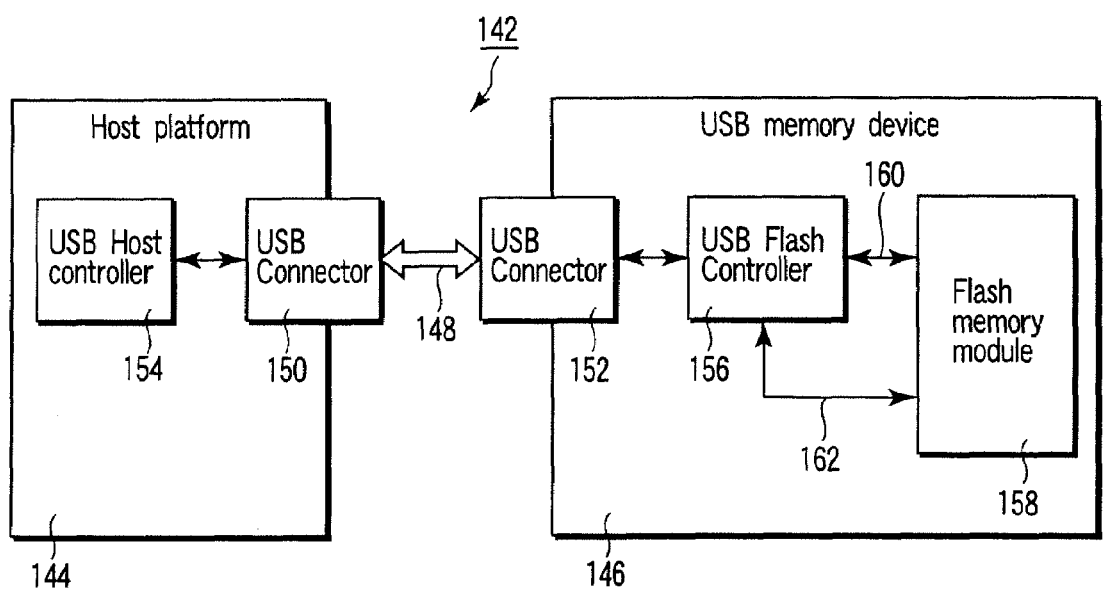
F I G. 34

NONVOLATILE SEMICONDUCTOR MEMORY DEVICE INCLUDING IMPROVED GATE ELECTRODE

CROSS-REFERENCE TO RELATED APPLICATIONS

This application is a divisional of U.S. application Ser. No. 11/118,478 filed May 2, 2005, now U.S. Pat. No. 7,122,858, which in turn is a divisional of U.S. application Ser. No. 10/648,5 10 filed on Aug. 27, 2003, now U.S. Pat. No. 7,078,763, and is based upon and claims the benefit of priority from the prior Japanese Patent Application No. 2003-49615, filed Feb. 26, 2003, the entire contents of each of which are incorporated herein by reference.

BACKGROUND OF THE INVENTION

1. Field of the Invention

The present invention relates to a nonvolatile semiconductor memory device which comprises, for example, a floating gate.

2. Description of the Related Art

FIGS. 23 to 25 show a NAND-type EEPROM in which related-art shallow trench isolation (STI) is used. FIG. 23 is a plan view, FIG. 24 is a sectional view taken along line 24-24 of FIG. 23, and FIG. 25 is a sectional view taken along line 25-25 of FIG. 23. As shown in FIG. 24, a gate insulating film GI is formed as a tunnel insulating film on a silicon substrate, and a floating gate FG is formed on the film. The floating gate FG is cut between cells disposed adjacent to each other, and is electrically insulated. A structure for cutting the floating gate FG is referred to as a slit. The side walls and upper part of the floating gate FG in the slit are coated with an inter-gate insulating film IGI. When the floating gate FG is coated with the tunnel insulating film and inter-gate insulating film, it is possible to hold electric charges in the floating gate FG for a long period. Furthermore, a control gate CG is formed on the inter-gate insulating film. The control gate CG is usually shared by a large number of cell transistors, has a function of simultaneously driving a large number of cell transistors, and is represented as a word line WL.

On the other hand, a sectional direction shown in FIG. 25 is usually represented as a bit line BL direction. In the bit line BL direction, as shown in FIG. 25, stacked gate structures shown in FIG. 24 are arranged on the substrate. A resist or processing mask layer is used to process each cell transistor in a self-matching manner. In a NAND-type memory in which a plurality of cells are connected in series to one another via a selection gate, a source and drain are shared by the cells disposed adjacent to each other, and cell area is reduced. Moreover, an interval between the word lines WL is processed in a minimum dimension of fine processing.

A high write potential is applied to the control gate CG and the substrate is grounded to implant electrons into the floating gate FG. With miniaturization of the cell transistor, parasitic capacitances between the adjacent cells and between the floating gate FG and peripheral structure increase. Therefore, a write voltage of the cell transistor tends to increase in order to raise a write rate. To raise the write voltage, it is necessary to secure an insulating withstand voltage between the control gates CG and to raise a pressure resistance of a word line driving circuit. Therefore, this is a large problem in increasing a density/rate of a memory element.

The potential at the write time is roughly calculated from the structure of FIGS. 24 and 25. Capacitors which hold the gate insulating film and tunnel insulating film can be regarded between the control gate CG and floating gate FG and between the floating gate FG and substrate, respectively. Therefore, a memory cell seen from the control gate CG is equivalent to a structure in which two capacitors are connected to each other in series.

FIG. 26 shows an equivalent circuit in which a capacitor capacitance between the control gate CG and floating gate FG is Cip and a capacitor capacitance between the floating gate FG and substrate is Ctox. A potential Vfg of the floating gate FG at a time when a high potential for write (Vpgm=Vcg) is applied to the control gate CG is determined by a capacitive coupling between Cip and Ctox, and roughly calculated by the following equation:

$$Vfg = Cr \times (Vcg - Vt + Vt0); \text{ and}$$

$$Cr = Cip/(Cip + Ctox),$$

wherein Vt denotes a threshold voltage of the cell transistor, and Vt0 denotes a threshold voltage (neutral threshold voltage) in a case in which any electric charge is not applied through the floating gate FG.

When the potential Vfg of the floating gate FG is large, a high electric field is applied to the tunnel insulating film, and electrons are easily implanted into the floating gate FG. It is seen from the above equation that with Vcg set to be constant, a capacitance ratio Cr may be increased to enlarge Vfg. That is, Cip needs to be set to be large with respect to Ctox in order to reduce the write potential.

The capacitance of the capacitor is proportional to the permittivity of a thin film disposed between the electrodes and area of an opposed electrode, and inversely proportional to a distance between the electrodes disposed opposite to each other. A leakage current flows through the tunnel insulating film through which the electric charge is passed for write/erase, and the write/erase is inhibited. Therefore, a method of increasing a contact area of the gate insulating film with the floating gate FG, and control gate CG is usually used in order to increase Cip. For example, a slit width is reduced to enlarge the width (dimension 1a shown in FIG. 24) of the upper surface of the floating gate FG. Alternatively, a technique of increasing the film thickness of the floating gate FG to increase a length (dimension 1b shown in FIG. 24) of a side wall of the floating gate FG has been developed. However, as a result, it is necessary to excessively reduce a slit processed dimension as compared with a gate or wiring material. Moreover, when the film thickness of the floating gate FG is increased, it is increasingly difficult to process the gate. Furthermore, with the miniaturization, the parasitic capacitance between FG and FG disposed opposite to each other between the word lines WL. To maintain the capacitance ratio in this manner is a large factor for inhibiting the miniaturization of the cell transistor.

To solve the problem, there has been proposed a technique of changing the constitution of the floating gate FG or control gate CG to lower the write voltage.

For example, a NAND-type EEPROM has been developed in which the capacitance between a booster plate and floating gate is increased and which can perform a write/erase/read operation with a low voltage (e.g., Jpn. Pat. Appln. KOKAI Publication No 11-145429).

Moreover, a nonvolatile memory element has been developed in which a coupling ratio of the floating gate to the control gate is increased and the write voltage is reduced to miniaturize the element (e.g., Jpn. Pat. Appln. KOKAI Publication No 2002-217318).

Furthermore, a nonvolatile semiconductor memory device has been developed including MOSFET in which the floating gates are formed in opposite side walls of the control gate to enhance write/erase/read characteristic and which is a memory element (e.g., Jpn. Pat. Appln. KOKAI Publication No 2002-50703).

Additionally, an AG-AND memory cell has been developed in which an assist gate is disposed adjacent to the floating gate (e.g., 2002 IEEE, 952-IEDM, 21.6.1, 10-MB/s Multi-Level Programming of Gb-Scale Flash Memory Enabled by New AG-AND Cell Technology).

However, even by the above-described related art, it has been difficult to reduce the parasitic capacitance around the floating gate and to increase the capacitance between the control gate and floating gate. It has also been difficult to lower the write voltage and to achieve high integration and high rate.

BRIEF SUMMARY OF THE INVENTION

According to an aspect of the invention, there is provided a nonvolatile semiconductor memory device comprising: a floating gate formed on a semiconductor substrate via a gate insulating film; diffused layers, as sources or drain regions, which are positioned on opposite sides of the floating gate and which are formed in the semiconductor substrate; first and second control gates which are formed on the opposite sides of the floating gate and which drive the floating gate; and an inter-gate insulating film which insulates the control gates from the floating gate and diffused layers.

According to another aspect of the invention, there is provided a nonvolatile semiconductor memory device comprising: a trench formed in a semiconductor substrate; a floating gate formed in a bottom portion of the trench via a first gate insulating film; diffused layers which are formed in the semiconductor substrate on opposite sides of the floating gate and which are source or drain regions; and first and second control gates which are positioned on the opposite diffused layers and which are formed on opposite side walls of the floating gate via an inter-gate insulating film and which drive the floating gate.

According to another aspect of the invention, there is provided a nonvolatile semiconductor memory device comprising: a floating gate formed above a semiconductor substrate; first and second control gates which are formed on opposite sides of the floating gate and which are insulated from the floating gate and semiconductor substrate; a first capacitance between the semiconductor substrate and floating gate; a second capacitance between the first control gate and floating gate; a third capacitance between the second control gate and floating gate; a fourth capacitance between the first control gate and semiconductor substrate; and a fifth capacitance between the second control gate and semiconductor substrate.

According to another aspect of the invention, there is provided a nonvolatile semiconductor memory device comprising: a cell transistor comprising a floating gate, source, and drain; and first and second control gates which are disposed on opposite sides of the floating gate of the cell transistor and via which the floating gate is selected.

According to another aspect of the invention, there is provided a nonvolatile semiconductor memory device comprising: cell transistors which comprise a floating gate, source, and drain and in which the source and drain disposed adjacent to each other are connected in series to each other; control gates disposed on opposite sides of the floating gate of each of the cell transistors; a first selection gate connected between one end of the cell transistors and bit line; and a second selection gate connected between the other end of the cell transistors and source line, wherein the floating gate is selected via the control gates on the opposite sides of the floating gate.

Figure 8A:
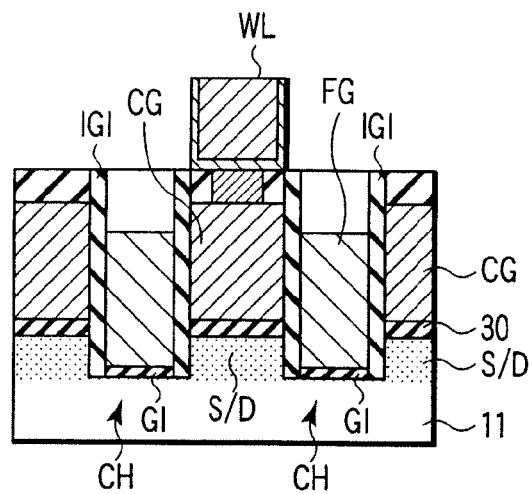
FIG. 8A is a sectional view taken along line 8A-8A of FIG. 7.
Figure 7:
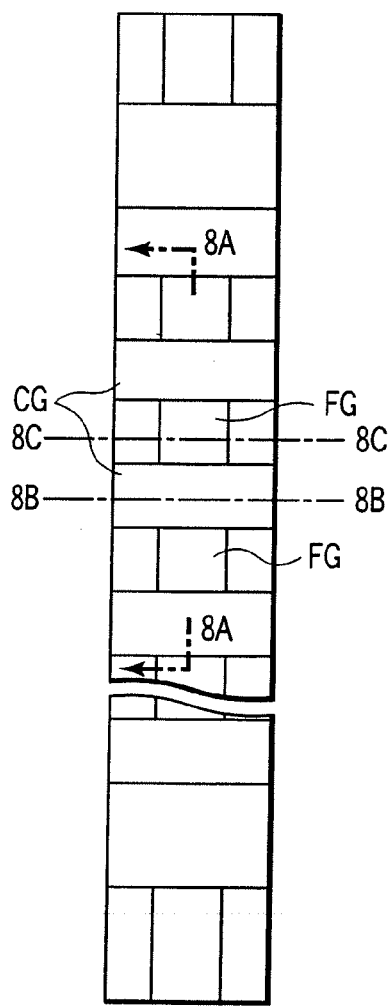
FIG. 7 is a plan view of the cell according to a second embodiment.
Figure 8B:
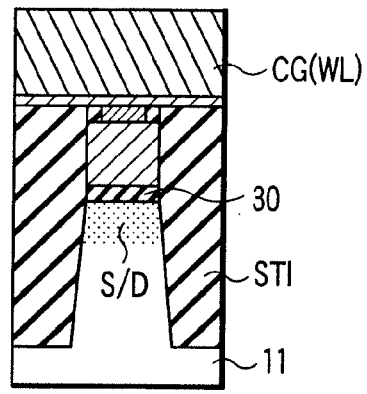
Figure 8C:
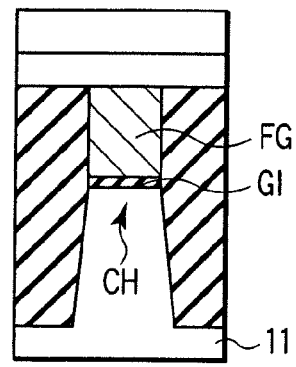
Figure 13:
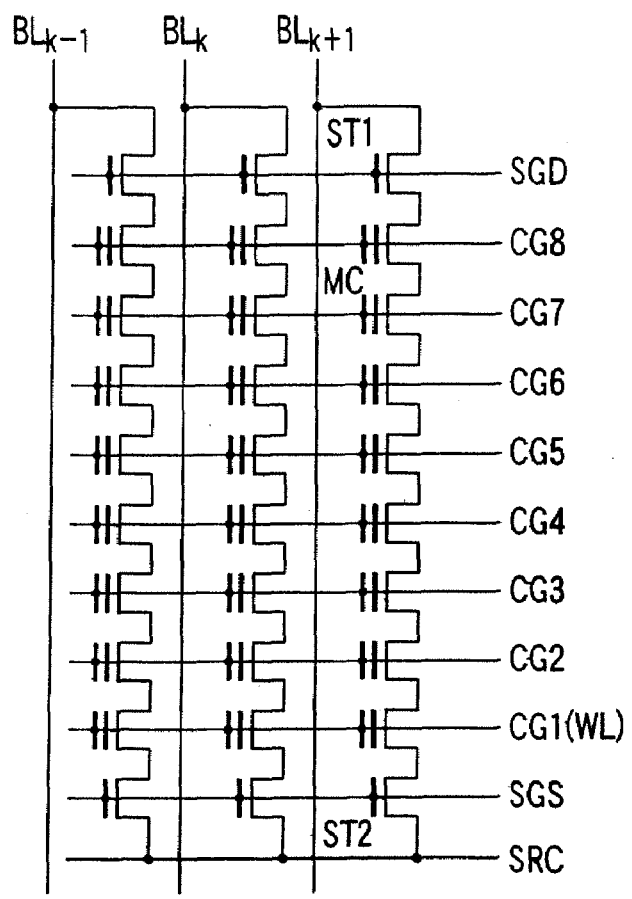
Figure 14:
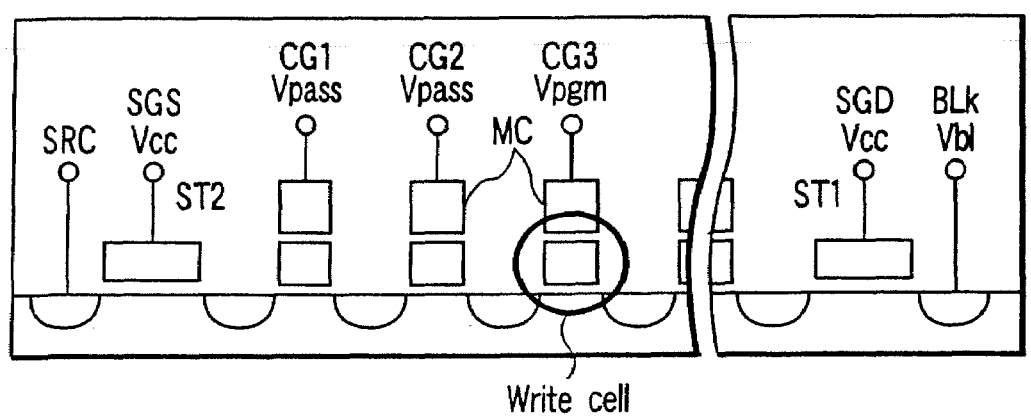
Figure 15:
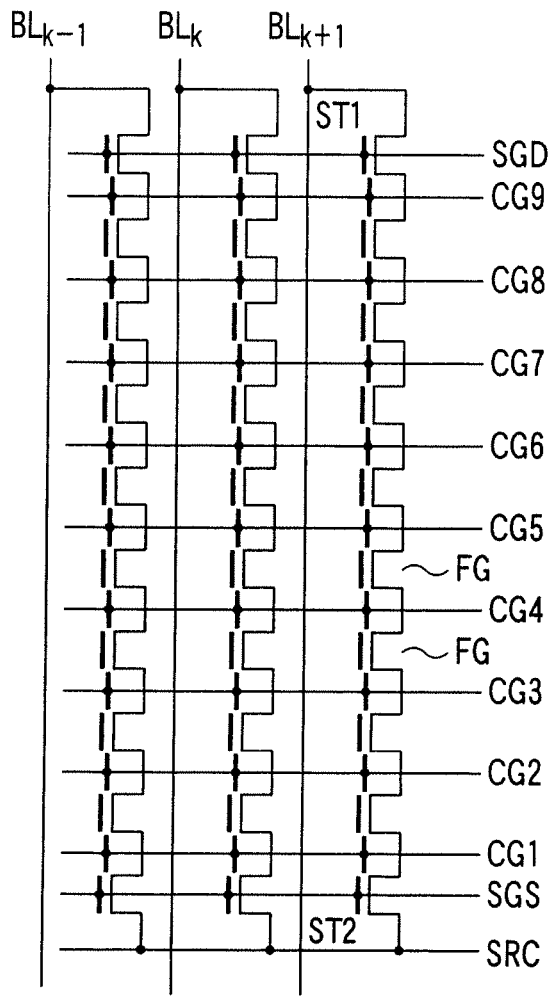
Figure 16:
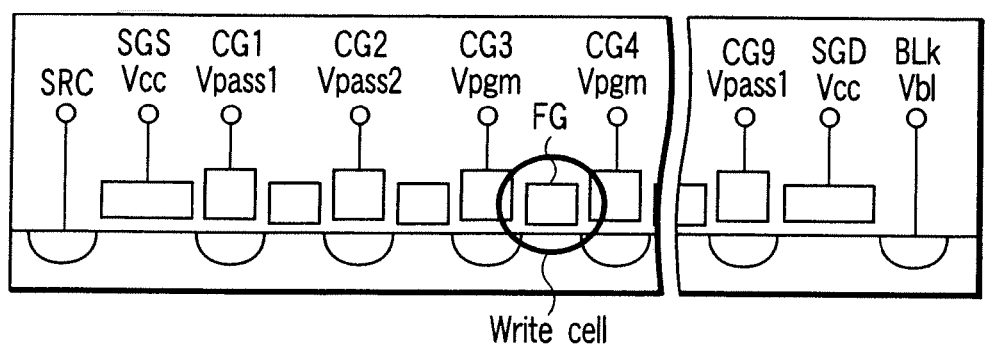
Figure 17:
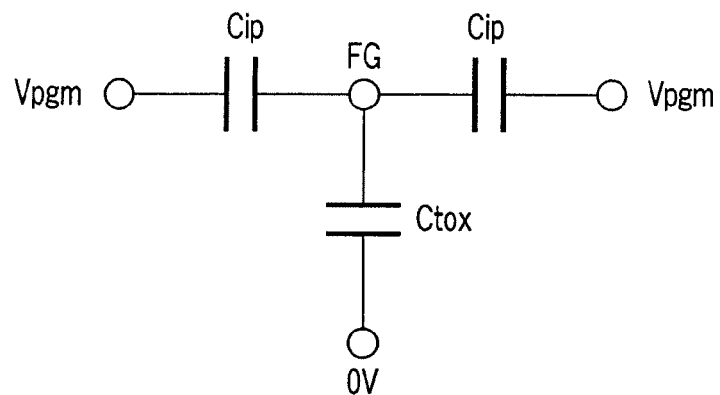
Figure 18:
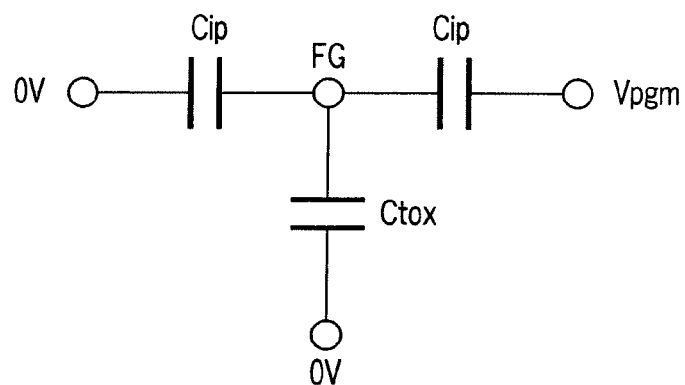
Figure 19:
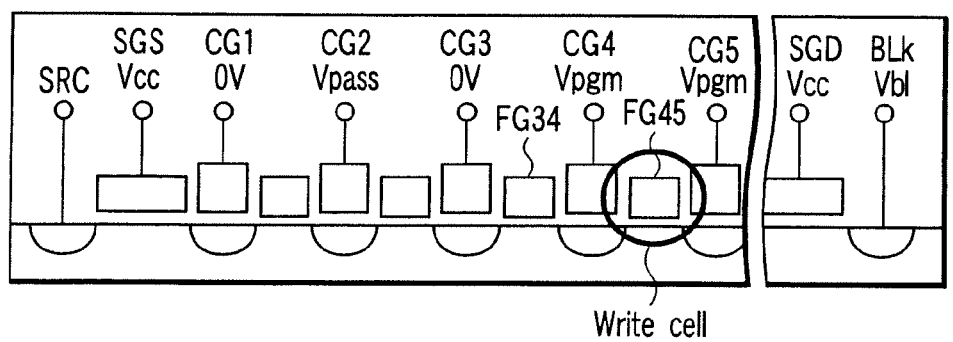
Figure 23:
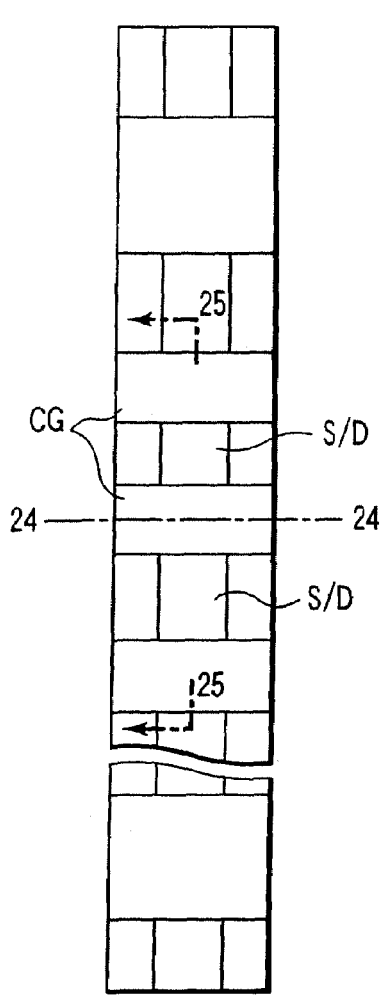
Figure 24:
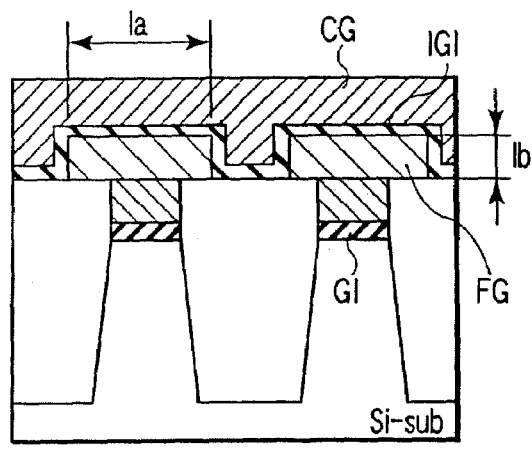
Figure 25:
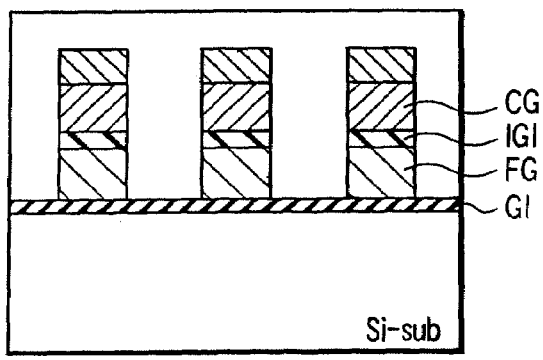
Figure 26:
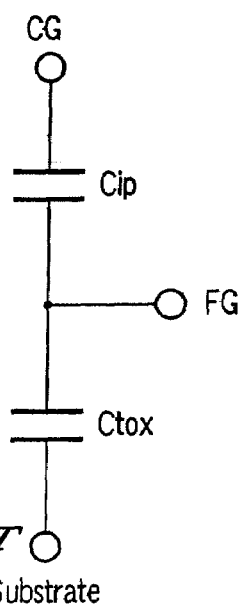
Figure 29:
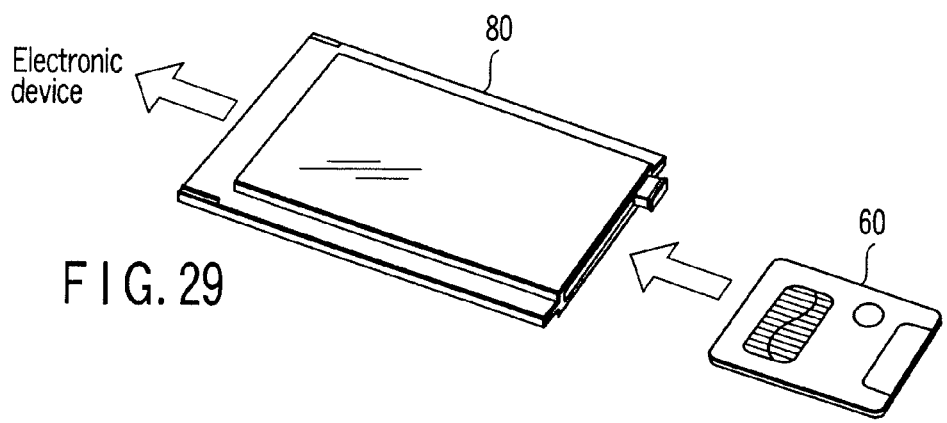
Figure 30:
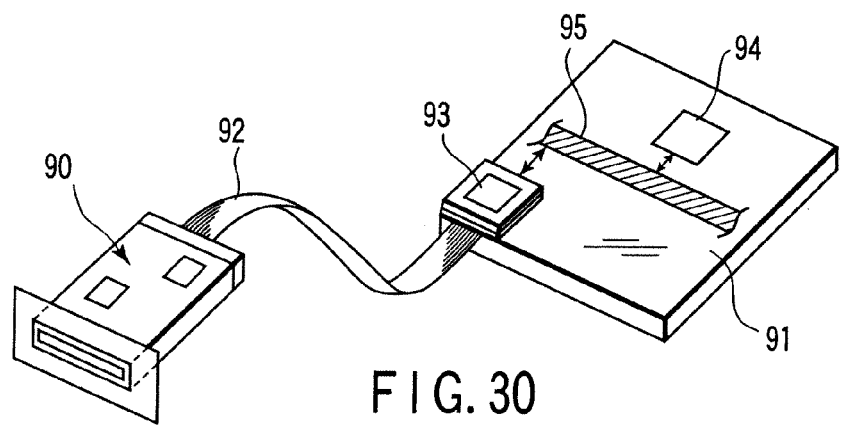
Figure 31:
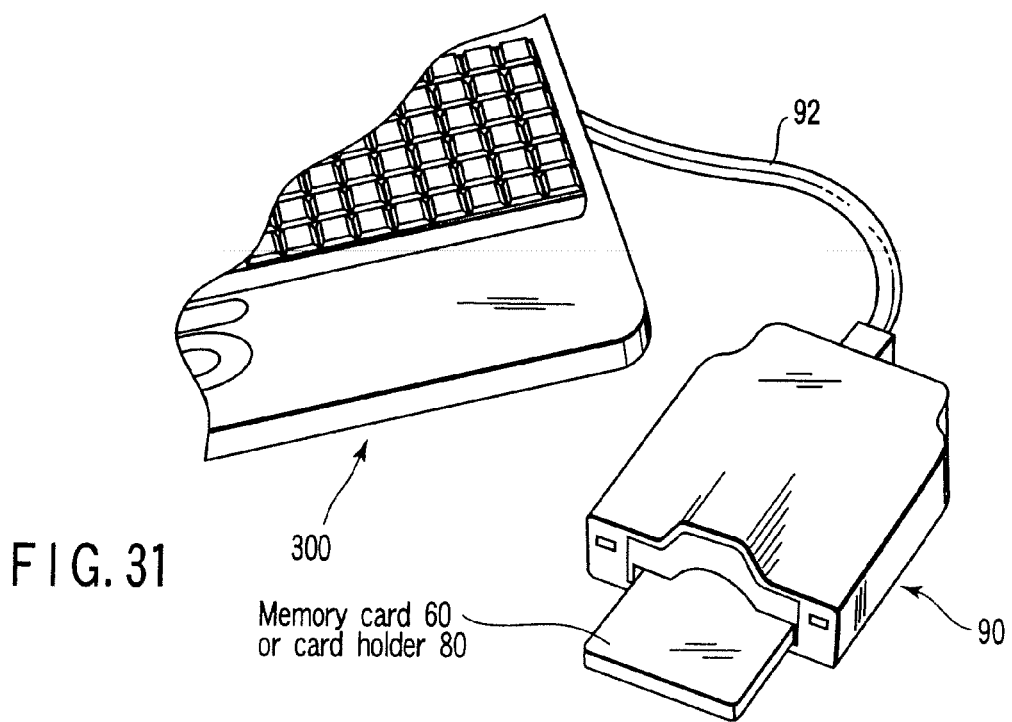
Figure 32:
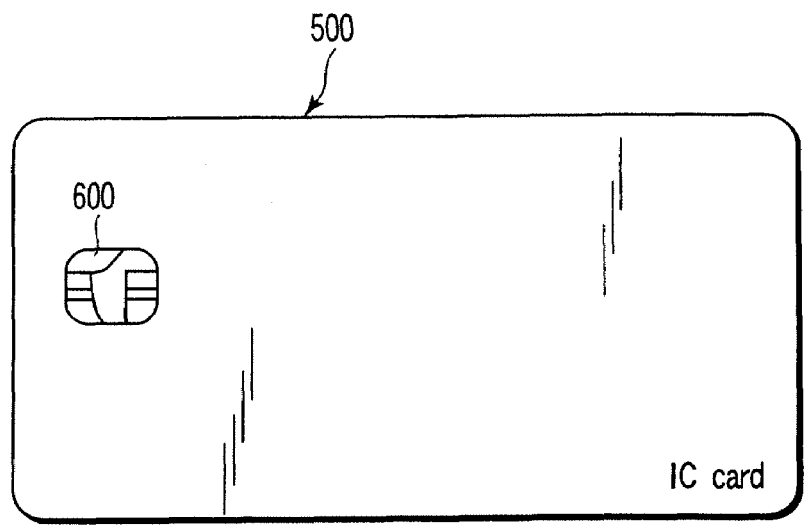
Figure 33:
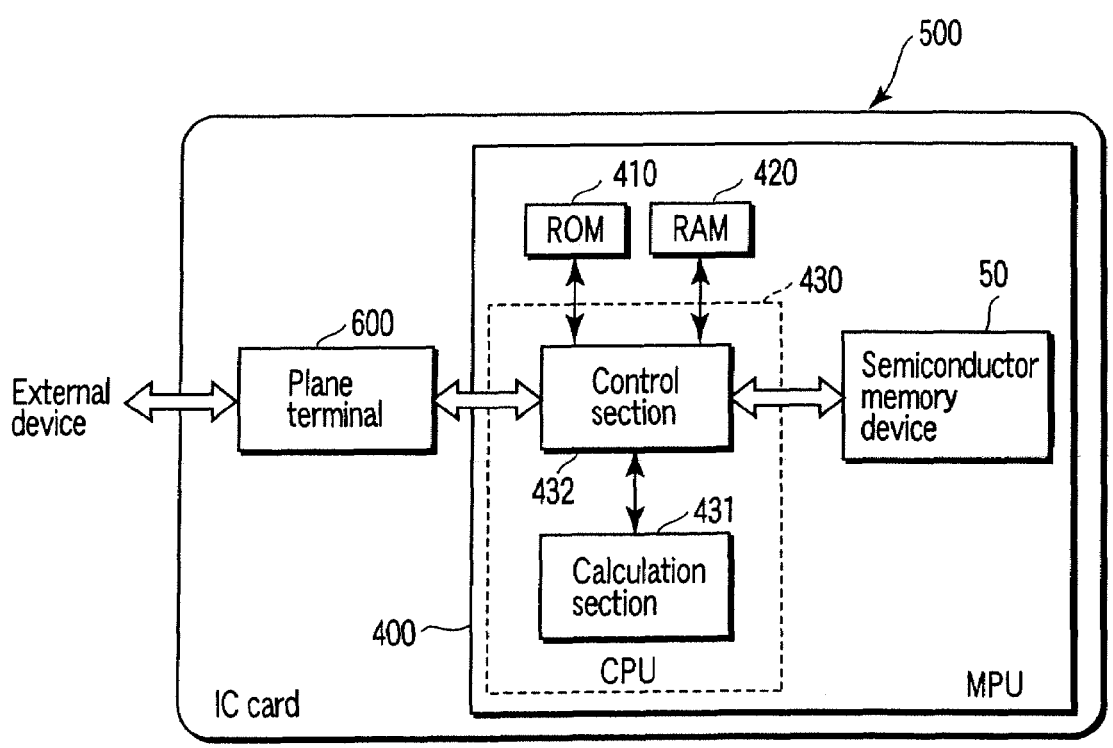

FIG, 8B is a sectional view taken along line 8B-8B of FIG. 7;

FIG. 8C is a sectional view taken along line 8C-8C of FIG. 7;

FIGS. 9A to 9F are sectional views showing the manufacturing method of the cell according to the second embodiment;

FIGS. 10A to 10C are sectional views showing the manufacturing method, following FIG. 9;

FIG. 11 is a sectional view showing a modification example of the second embodiment;

FIG. 12 is a sectional view showing further modification example of a constitution shown in FIG. 11;

FIG. 13 is a circuit diagram showing a related-art NAND-type EEPROM;

FIG. 14 is a diagram showing one example of a potential in writing data in a memory cell;

FIG. 15 is a circuit diagram showing the NAND-type EEPROM in which the cells are used according to the first and second embodiments;

FIG. 16 is a diagram showing one example of the potential in writing the data in the memory cell shown in FIG. 15;

FIG. 17 is an equivalent circuit diagram showing one example of potential setting at a write time in the memory cell shown in FIG. 16;

FIG. 18 is an equivalent circuit diagram showing another example of potential setting at the write time in the memory cell shown in FIG. 16;

FIG. 19 is a diagram showing an example of data write in which potential settings shown in FIGS. 17 and 18 are used;

FIG. 20 is a diagram showing the potential in erasing data according to a fifth embodiment;

FIG. 21 is a diagram showing the potential in reading the data according to a sixth embodiment;

FIG. 22 is a diagram showing the potential in reading the data according to the sixth embodiment;

FIG. 23 is a plan view showing one example of a related-art nonvolatile semiconductor memory device;

FIG. 24 is a sectional view taken along line 24-24 of FIG. 23;

FIG. 25 is a sectional view taken along line 25-25 of FIG. 23;

FIG. 26 is a diagram showing the equivalent circuit of FIG. 23;

FIG. 27 is a block diagram showing an illustrative internal structure of a memory card in accordance with an embodiment of the present invention;

FIG. 28 is a block diagram showing an illustrative internal structure of a memory card in accordance with an embodiment of the present invention;

FIG. 29 is an illustrative example of cardholder and a memory card in accordance with an embodiment of the present invention;

FIG. 30 is an illustrative example of a connecting apparatus operable to receive a memory card or cardholder;

FIG. 31 is an illustrative example of a connecting apparatus connected to a personal computer via a connecting wire and having a memory card inserted therein;

FIG. 32 is a plan view showing an IC card in accordance with an embodiment of the present invention;

FIG. 33 is a block diagram of an IC card in accordance with an embodiment of the present invention; and FIG. 34 is a block diagram showing one example of a USB memory device to which the nonvolatile semiconductor storage device according to each embodiment is applied.

DETAILED DESCRIPTION OF THE INVENTION

Embodiments of The present invention will be described hereinafter with reference to the drawings.

FIRST EMBODIMENT

Figure 1:
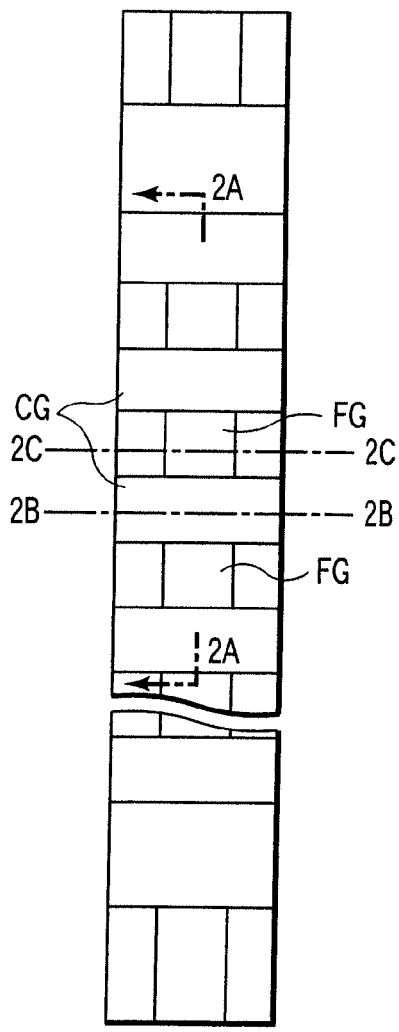
FIG. 1 is a plan view showing a cell according to a first embodiment.
Figure 2A:
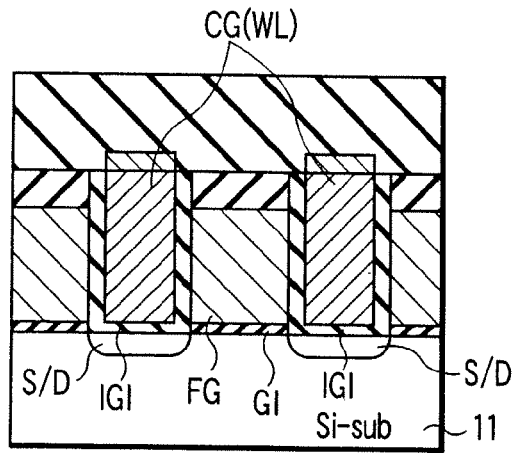
FIG. 2A is a sectional view taken along line 2A-2A of FIG. 1.
Figure 2B:
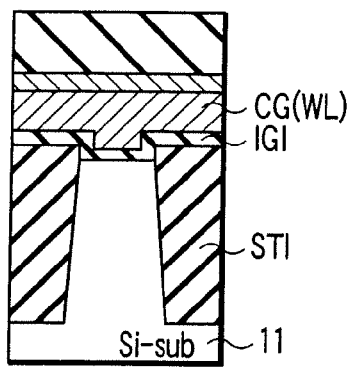
FIG. 2B is a sectional view taken along line 2B-2B of FIG. 1.
Figure 2C:
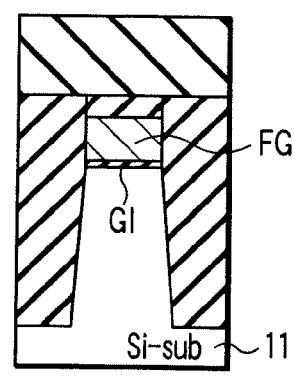
FIG. 2C is a sectional view taken along line 2C-2C of FIG. 1.

FIGS. 1 and 2A to 2C showing a cell according to a first embodiment. FIG. 1 is a plan view of the cell, FIG. 2A is a sectional view taken along line 2A-2A of FIG. 1, FIG. 2B is a sectional view taken along line 2B-2B of FIG. 1, and FIG. 2C is a sectional view taken along line 2C-2C of FIG. 1.

For the cell according to the first embodiment, as shown in FIG. 2A, control gates CG are formed on opposite sides of a floating gate FG via inter-gate insulating films IGI. These control gates CG are formed above a source/drain region (S/D) including a diffused layer formed in a substrate 11 on the opposite sides of the floating gate FG. That is, these control gates CG contact the opposite side walls of the floating gate FG and the diffused layer via the inter-gate insulating films IGI. In the related-art cell, one control gate CG drives one floating gate FG. On the other hand, the cell of the first embodiment is driven by two control gates CG positioned on the opposite sides of the floating gate FG.

Figure 3:
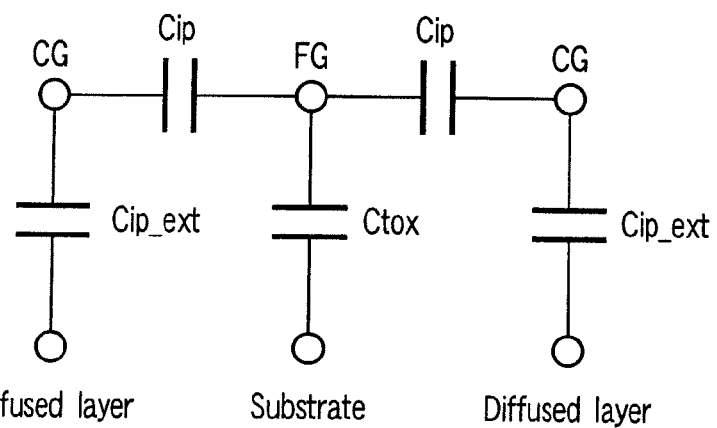
FIG. 3 is an equivalent circuit diagram of the cell according to the first embodiment.

FIG. 3 shows an equivalent circuit of the cell according to the first embodiment. Here, Cip denotes a capacitance between the control gate CG and floating gate FG, Cip_ext denotes a capacitance between the control gate CG and substrate, and Ctox is a capacitance between the floating gate FG and substrate. In this equivalent circuit, when two control gates CG disposed adjacent to one floating gate FG are assumed to have the same potential (Vcg), a capacitance ratio (Cr) to determine a potential Vfg of the floating gate is roughly calculated by the following equation.

$$Cr = Cip/(Cip + Ctox)$$
$$= (2 \cdot \varepsilon ip \cdot W \cdot Tfg/Tip)/((2 \cdot \varepsilon ip \cdot W \cdot Tfg/Tip) + \varepsilon tox \cdot W \cdot L/Ttox),$$

wherein $\varepsilon ip$: permittivity of the inter-gate insulating film, $\varepsilon tox$: permittivity of the tunnel insulating film, W: channel width of the cell transistor, L: gate length of the cell transistor, Tfg: FG film thickness, Ttox: film thickness of the tunnel insulating film, and Tip: film thickness of the inter-gate insulating film.

As seen from the above equation, for the cell transistor of the present embodiment, even when a channel width or gate length of a transistor as minimum processing dimensions are not changed, the film thickness Tfg of the floating gate can be increased to increase Cr. This means that even with miniaturization of the cell, the capacitance ratio can be improved.

Moreover, as shown in FIG. 2A, a space between two floating gates FG is subsequently completely filled with the control gate CG. Therefore, two parasitic capacitances are almost shielded including: a capacitive coupling between the floating gates FG disposed adjacent to each other in a word line WL direction, which has been a problem in a related-art cell; and a fringe capacitance between the substrate in which the source/drain region of the cell transistor is formed and the floating gate FG.

As described above, in the cell of the first embodiment, when the film thickness of the floating gate FG is increased without considering any increase of the parasitic capacitance, the capacitance ratio can be secured. As a result, even when the gate length or channel width of the cell transistor is miniaturized, the capacitance ratio can be increased. Additionally, since the capacitance ratio can be increased, the write voltage can be reduced. Therefore, according to the first embodiment, it is possible to simultaneously satisfy the miniaturization of the cell and the reduction of the write voltage.

FIGS. 4A to 5B show a manufacturing method of the cell according to the first embodiment.

Figure 4A:
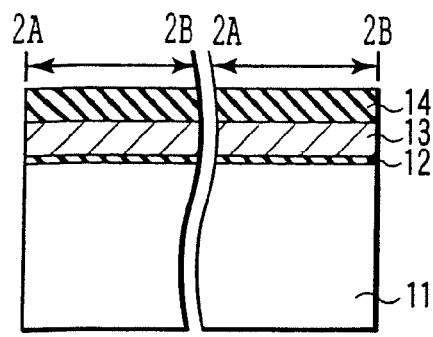
FIGS. 4A to 4F are sectionals view showing a manufacturing method of the cell according to the first embodiment.

First, as shown in FIG. 4A, a tunnel insulating film 12, for example, of a silicon oxide film is formed on a silicon substrate 11. For example, a polysilicon layer 13 and mask layer 14 are successively formed on the tunnel insulating film 12 to form the floating gate. For this mask layer 14, for example, the silicon oxide film, or a silicon nitride film is applied. For this mask layer 14, minimum requirements are that a selection ratio of the mask layer to the polysilicon layer 13 is obtained in etching the polysilicon layer 13. However, more preferably, the selection ratio to the insulating film for filling is obtained in a chemical mechanical polishing (CMP) step during the forming of STI described later, and the selection ratio to the control gate is obtained in the CMP step during the forming of the control gate.

Figure 4D:
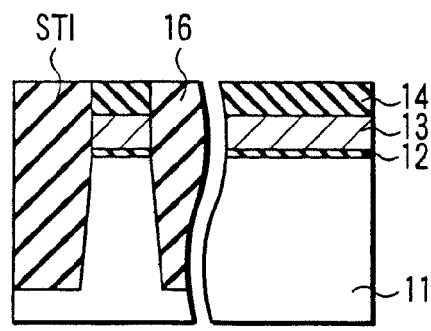
Figure 4B:
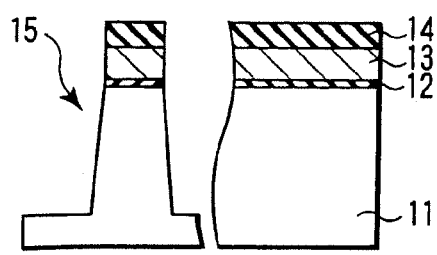

As shown in FIG. 4B, the mask layer 14 is patterned by lithography and selective etching steps. This patterned mask layer 14 is used to etch the polysilicon layer 13, tunnel insulating film 12, and substrate 11 in order, so that a shallow trench 15 for isolating elements is formed.

Figure 4E:
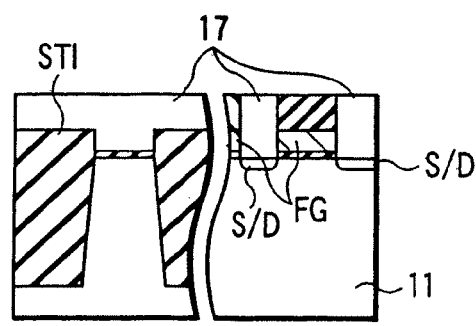
Figure 4C:
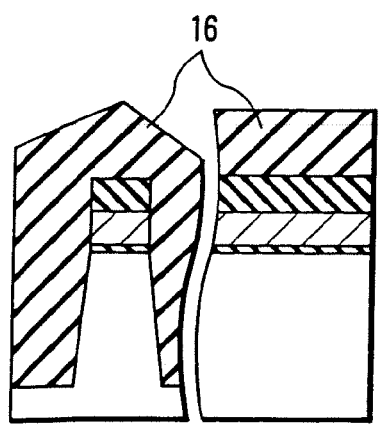

Thereafter, as shown in FIG. 4C, an insulating film 16, for example, of the silicon oxide film is formed on the whole surface by chemical vapor deposition (CVD) to fill the trench 15 formed in the substrate 11. Subsequently, as shown in FIG. 4D, the mask layer 14 is used as a stopper to polish the insulating film 16 down to the mask layer 14 by the CMP step, and an STI is formed.

Subsequently, as shown in FIG. 4E, the lithography step and selective etching step are successively performed to etch the insulating films 14, 16 and polysilicon layer 13. As a result, a trench 17 and floating gate FG for forming the control gate CG (word line WL) are formed. At this time, a portion in which the control gate is to be formed is etched until the substrate 11 is exposed. For an STI portion, the etching needs to stop above the tunnel insulating film 12. That is, the etching of the STI portion preferably stops at a height from the upper surface of the substrate 11 so as to have the film thickness necessary for an insulating characteristic. Thereafter, an appropriate heat step or insulating film forming step is successively performed. Furthermore, the floating gate FG and mask layer 14 are used as the masks to implant impurity ions in the substrate 11, and a diffused layer is formed to constitute the source/drain region (S/D) of the cell transistor.

Figure 4F:
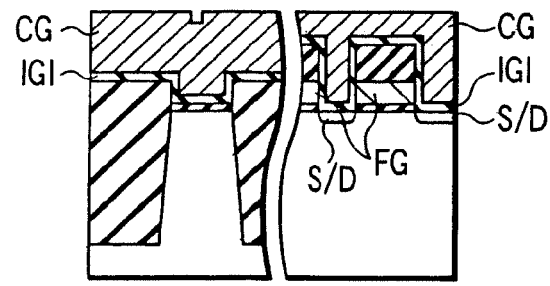

Thereafter, as shown in FIG. 4F, the inter-gate insulating film IGI and control gate CG are successively formed in the whole surface. The inter-gate insulating film IGI contacts the opposite side walls of the floating gate FG and the bottom surface of the trench 17, that is, the source/drain region (S/D). The inter-gate insulating film IGI is thicker than the tunnel insulating film GI. This inter-gate insulating film IGI is formed by a stacked film including any one or at least two, for example, of aluminum oxide, hafnium oxide, silicon oxide, silicon nitride, and zirconia oxide.

Figure 5A:
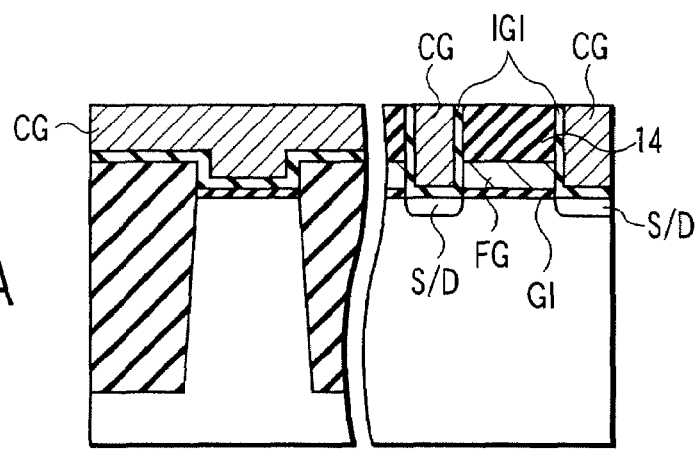
FIGS. 5A and 5B are sectional views showing a manufacturing method, following FIG. 4.
Figure 5B:
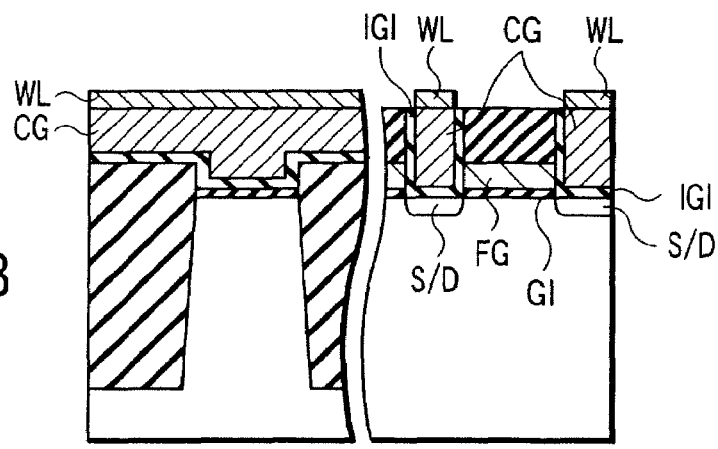

Thereafter, as shown in FIG. 5A, the control gate CG is polished down to the mask layer 14 by CMP. Furthermore, as shown in FIG. 5B, a metal thin film is formed in the whole surface and heated/treated, and the mask layer 14 is used as a control film of salicide reaction to form a metal salicide layer only in an upper part of the control gate CG. IN this manner, the word line is formed of the metal salicide layer.

It is to be noted that the control gate CG has been described as the salicide layer. However, in the present embodiment, since the control gate CG is formed in a self-matching manner with respect to the floating gate FG, it is possible to form a metal wiring in the upper surface of the control gate CG. Furthermore, it is also, of course, possible to form the control gate CG per se by a metal material. To handle this mode, the following materials can be applied to the control gate CG.

Examples of the metal material for use in a salicide structure include titanium, cobalt, and nickel. Moreover, when the control gate CG per se is the metal material, for example, it is possible to apply the stacked films including any one or at least two of titanium, tungsten, tungsten nitride, and titanium nitride.

In the present embodiment, the control gates CG are formed on the opposite side surfaces of the floating gate FG via the inter-gate insulating film IGI. Therefore, the capacitive coupling between the floating gate FG and control gate CG increases as compared with the related art. Therefore, the material of the wiring of the control gate CG needs to have a sufficiently low resistance value.

At a forming time of the inter-gate insulating film IGI, the forming of the insulating film is appropriately combined with an etch-back step to increase the film thickness of the insulating film positioned in the bottom portion of the control gate CG with respect to the inter-gate insulating film thickness of the floating gate FG side wall. Accordingly, an insulating withstand pressure between the control gate CG and substrate can also be strengthened.

Figure 6:
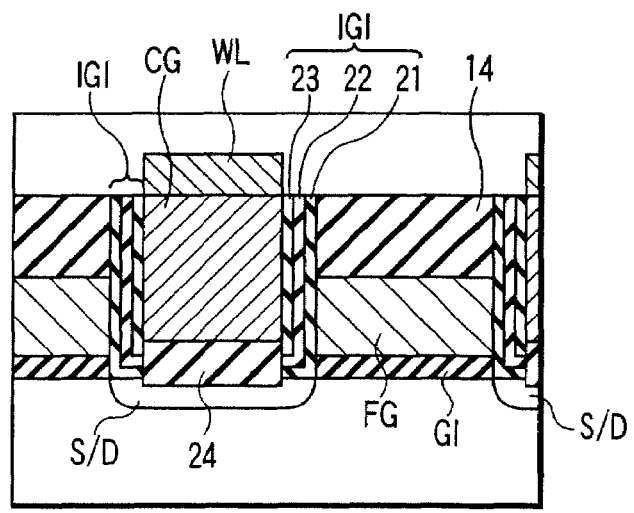
FIG. 6 is a sectional view showing a modification example of an inter-gate insulating film.

FIG. 6 shows a modification example of the inter-gate insulating film IGI, and shows a sectional view in a case in which the inter-gate insulating film IGI is formed by an ONO film as a stacked film. In this case, as shown in FIG. 4E, after etching the tunnel insulating film GI to form the trench 17, a silicon oxide film 21 and silicon nitride film 22 are stacked/formed in the trench 17. Thereafter, these films are etched back to expose the substrate 11 only in a control gate forming portion. Thereafter, the silicon oxide film having an appropriate film thickness is formed. The floating gate FG side wall is coated with the silicon nitride film 22. Therefore, the forming of a silicon oxide film 23 is inhibited. However, for example, a silicon oxide film 24 having a film thickness larger than that of the tunnel insulating film GI is formed in a lower portion of the trench. Thereafter, the silicon oxide film may further be stacked/formed on the side wall of the floating gate FG.

The above-described process can also be used in an inter-gate insulating film other than the ONO film. For example, a single layer or stacked film including an aluminum oxide film is used as the inter-gate insulating film IGI, and the silicon oxide film is used as the insulating film formed in the bottom portion of the control gate CG. In this case, it is also possible to appropriately combine the insulating films which are different from one another in a film forming rate or etching rate.

According to the first embodiment, the control gate CG contacts the opposite side walls of one floating gate FG via the inter-gate insulating film IGI. Therefore, when the film thickness of the floating gate FG is increased without changing the channel width or gate length of the cell transistor, the capacitance ratio can be increased. Additionally, when the control gate is disposed between the floating gates, the parasitic capacitance around the floating gate can be reduced. Therefore, the miniaturization of the cell and the reduction of the write voltage can be realized.

SECOND EMBODIMENT

FIGS. 7, 8 show a second embodiment. FIG. 7 is a plan view of the cell according to the second embodiment, FIG. 8A is a sectional view taken along line 8A-8A of FIG. 7, FIG. 8B is a sectional view taken along line 8B-8B of FIG. 7, and FIG. 8C is a sectional view taken along line 8C-8C of FIG. 7.

Also in the second embodiment, in the same manner as in the first embodiment, the control gates CG are formed in the opposite side surfaces of one floating gate FG, and two control gates CG control the floating gate FG.

In the second embodiment, as shown in FIG. 8A, a channel portion CH of the cell transistor is formed in a position deeper than that of the diffused layer which is the source/drain region (S/D) in the substrate 11. Therefore, different from the first embodiment, after the control gate CG is formed, the floating gate FG is formed. As a result, when the depth of the channel portion CH in the substrate 11 is appropriately set, it is possible to reduce a short channel effect by diffusion of impurities of the source/drain region (S/D).

Moreover, a method of the second embodiment comprises: etching the substrate and forming the trench to form the floating gate FG; and subsequently forming the inter-gate insulating film IGI in the side wall of the etched trench. The film thickness of the inter-gate insulating film IGI is larger than that of the tunnel insulating film (first gate insulating film) GI because of the purpose of the inter-gate insulating film. Therefore, the film through which a tunnel current flows is limited to the gate insulating film GI which is positioned in the bottom portion of the floating gate FG. Therefore, it is possible to avoid the flowing of the tunnel current through the side wall of the silicon substrate 11 and corners of the bottom portion of the floating gate FG which are different in crystalline orientation.

FIGS. 9A to 10C show the manufacturing process of the cell according to the second embodiment.

Figure 9A:
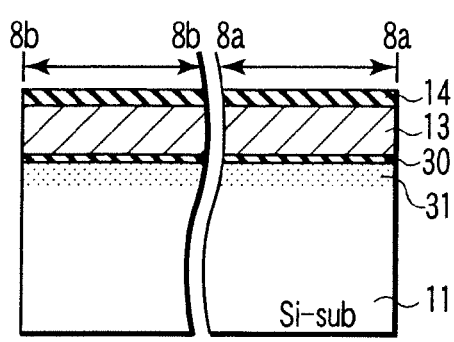

First, as shown in FIG. 9A, after forming a diffused layer 31 which is a source/drain of the cell transistor on the silicon substrate 11, for example, a silicon oxide film (second gate insulating film) 30, polysilicon layer 13 which forms the control gate CG, and mask layer 14, for example, of the silicon nitride film are successively formed. The materials of the mask layer 14 are determined on conditions similar to those of the first embodiment.

Figure 9B:
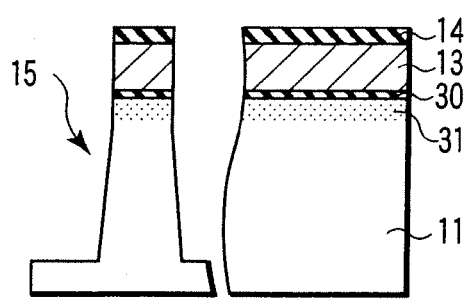

As shown in FIG. 9B, the mask layer 14 is patterned by the lithography and selective etching steps, the patterned mask layer 14 is used to etch the polysilicon layer 13, silicon oxide film 30 which is the control gate insulating film, and substrate 11 in order, and the shallow trench 15 for isolating the elements is formed.

Figure 9C:
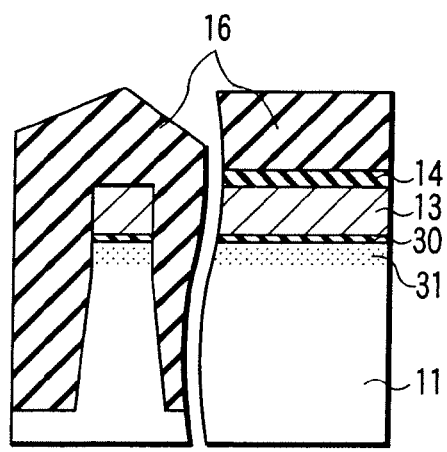
Figure 9D:
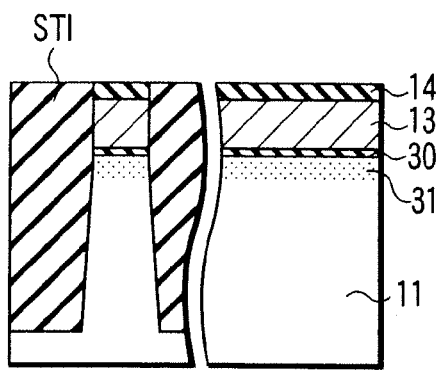

Thereafter, as shown in FIG. 9C, the insulating film 16, for example, of the silicon oxide film is formed in the whole surface by CVD to fill the trench 15. Subsequently, as shown in FIG. 9D, the mask layer 14 is used as a stopper to polish the insulating film 16 by CMP, and an STI is formed.

Figure 9E:
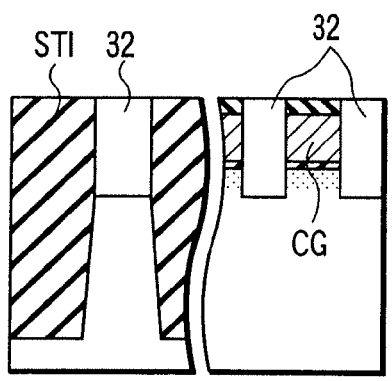

Subsequently, as shown in FIG. 9E, the lithography and selective etching steps are used to etch the mask layer 14, polysilicon layer 13, control gate insulating film 30, and substrate 11 of a portion forming the floating gate FG, and a trench 32 for forming the floating gate FG is formed. This trench 32 is formed deeper than the diffused layer 31 which is the source/drain region (S/D). Moreover, by this etching, the floating gate FG is formed between the trenches 32. Furthermore, at this time, preferably for the STI portion, the filling insulating film is hardly etched by the selective etching.

Figure 9F:
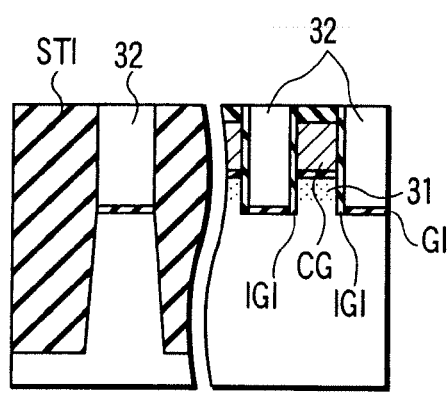

Therefore, after performing the heat treatment, as shown in FIG. 9F, the inter-gate insulating film IGI is formed in the trench 32. Subsequently, after the inter-gate insulating film IGI of a trench 32 bottom portion is removed, the impurity ions are implanted in the substrate 11, and channel profile of the cell transistor is controlled. It is to be noted that the threshold voltage of the cell transistor is adjusted by the profile of a well of a cell forming region and the depth of the trench 32. Accordingly, it is possible to omit an adjustment step of the channel profile. Subsequently, the tunnel insulating film GI is formed in the bottom portion of the trench 32. The film thickness of the control gate insulating film 30 is set to be equal to or more than that of the inter-gate insulating film IGI.

Therefore, as shown in FIG. 10A, a wiring material forming the floating gate FG is stacked in the whole surface and etched back to form the floating gate FG in the trench 32. The position of the etched-back upper surface of the floating gate FG is preferably controlled to be distant from the upper surface of the control gate CG by a distance by which appropriate insulating resistance is obtained. At this time, to enhance controllability of the height of the floating gate FG, for example, the mask layer 14 is used as a stopper to polish the wiring material forming the floating gate FG by CMP. Thereafter, it is also possible to etch back the wiring material.

Subsequently, as shown in FIG. 10B, after forming the insulating film (not shown) in the whole surface to insulate the floating gate FG, the CMP step is performed to expose only the control gate CG.

Thereafter, as shown in FIG. 10C, the height of the control gate CG upper surface is lowered by a selective etch-back step to form an insulating film 33 in the whole surface. This insulating film 33 is formed, for example, by a silicon nitride single layer or stacked film containing silicon nitride. Thereafter, the insulating film 33 is etched back. Furthermore, an opening 34 narrower than the width of the control gate CG is formed in the insulating film 33 positioned in the upper surface of the control gate CG. The insulating film 33 formed herein is preferably set to have an appropriate film thickness in order to sufficiently secure the withstand pressure with the adjacent control gate CG. Thereafter, the lithography and selective etching steps for forming the word line WL are performed to form the word line WL connected to the control gate CG.

Concretely, for example, it is possible to use a method comprising: forming a metal film in the whole surface; and subsequently selectively etching the metal film to form the word line WL. Alternatively, a method can be used comprising: forming the insulating film in the whole surface; subsequently forming the trench in the insulating film; embedding the metal film in the trench; flattering the metal film by CMP; and forming the word line WL in the trench. Additionally, it is possible to use a method of forming a usual wiring.

It is considered that alignment deviation is generated in the lithography step for forming the word line WL. However, it is possible to sufficiently secure the withstand pressure between the word lines WL disposed adjacent to each other by an opening 34 formed in the upper surface of the control gate CG in the self-matching manner. Moreover, in order to reduce contact resistance between the control gate CG and wiring material, it is also possible to perform a salicide step of the control gate CG before forming the wiring. FIG. 10C shows a sectional view in forming WL by CMP. In FIG. 10C, a control gate CG salicide step is not performed.

FIG. 11 shows a modification example of the second embodiment. This modification example relates to a manufacturing method in a case in which a broad gate control region is necessary. The method comprises: etching the polysilicon layer 13 and insulating film 12 which are the control gates CG in the step shown in FIG. 9E; forming a shallower trench 41 shown in FIG. 11; and forming the inter-gate insulating film IGI in the side wall of the trench 41. Accordingly, it is possible to form the inter-gate insulating film IGI only in the side wall of the control gate CG. Thereafter, the substrate 11 is further etched to form a trench 41a which is connected to the trench 41. The tunnel insulating film (first gate insulating film) GI is formed in the side wall and bottom portion of the trench 41a. In this manner, it is possible to form a broad gate control region in which all the lower parts of the floating gates FG contact the tunnel insulating film GI.

FIG. 12 shows an example obtained by further modifying the constitution shown in FIG. 11, and the same parts as those of FIG. 11 are denoted with the same reference numerals. In the modification example shown in FIG. 12, the forming step of the insulating film is appropriately combined with the etch-back step, and the film thickness of the insulating film positioned in the bottom portion of the floating gate FG is set to be different from that of the insulating film positioned in a side portion. That is, in the modification example, the film thickness of an insulating film (first gate insulating film) GIa positioned in the bottom portion of the floating gate FG is set to be smaller than that of an insulating film (third gate insulating film) GIb positioned in the side portion. Assuming that the film thickness of the inter-gate insulating film IGI is T1, that of the insulating film GIb is T2, and that of the insulating film GIa is T3, a relation among these is T1>T2>T3. In this manner, it is also possible to set the film thicknesses of the region GIa through which the tunnel current flows and the region GIb through which the tunnel current does not flow to desired values.

According to the second embodiment, the bottom portion of the floating gate FG is position below that of the control gate CG, and the channel portion CH of the cell transistor is formed in a position deeper than that of the source/drain region (S/D) in the substrate 11. Therefore, the short channel effect by the diffusion of the impurities of the source/drain region (S/D) can be reduced.

Moreover, as shown in FIG. 11, all the side walls and bottom portions of the floating gate FG are brought into contact with the tunnel insulating film GI, so that the broad gate control region can be formed. Therefore, a movement amount of electric charges with respect to the floating gates FG can be improved.

Furthermore, as shown in FIG. 12, the film thickness of the insulating film GIa positioned in the bottom portion of the floating gate FG is set to be smaller than that of the insulating film GIb positioned in the side portion. Accordingly, the tunnel current can be passed only through the tunnel insulating film GIa positioned in the bottom portion of the floating gate FG. Therefore, it is possible to avoid the flowing of the tunnel current through the side wall of the silicon substrate 11 and the corners of the bottom portion of the floating gate FG which are different in the crystalline orientation.

THIRD EMBODIMENT

In a third embodiment, an operation of a NAND-type EEPROM in which the cell including the constitution described in the first and second embodiments is used will be described.

First, the related-art NAND-type EEPROM will be described with reference to FIGS. 13, 14. FIG. 13 shows the circuit constitution of the related-art NAND-type EEPROM, and FIG. 14 shows one example of the potential in writing data in the memory cell in the NAND-type EEPROM. In FIGS. 13 and 14, the same parts are denoted with the same reference numerals.

The NAND-type EEPROM is constituted by connecting the cell transistors which are adjacent memory cells MC, and the sources and drains of selection gates ST1, ST2 in series to one another. The respective selection gates ST2 are connected to a common source line SRC. In this constitution, for example, for example, a bit line BLk shown in FIG. 13 is used as a write bit line, and BLk+1, BLk−1 are used as write inhibiting bit lines.

At a write time of the data, a predetermined gate potential Vsg is applied to the selection gate line SG1 on a bit line side. Next, a sufficiently low potential VBLpgm is supplied to the bit line to perform the write. The gate potential Vsg is set to a potential at which the selection gate ST1 can sufficiently be turned on with respect to VBLpgm. On the other hand, a sufficiently high potential VBLinhibit is supplied to the bit lines BLk+1, BLk−1 which inhibit the write. VBLinhibit is set to a potential at which the selection gate ST1 is sufficiently off. In the cell transistor in which VBLpgm is supplied to the bit line, the selection gate ST1 is turned on and VBLpgm is transmitted to the cell transistor. Therefore, the channel potential of the cell transistor is sufficiently lowered to perform the write.

On the other hand, in the cell transistor in which VBLinhibit is supplied to the bit line, the selection gate ST1 is off. Therefore, the channel potential of the cell transistor rises by the capacitive coupling with the control gate CG and the write is not performed. This state is a write inhibiting state.

For the related-art EEPROM, at the write time of the data, in either an operation of supplying the write potential Vpgm to the selected word line WL to write the data in the cell, or an operation of supplying a transfer potential Vpass to the non-selected word line WL to form the channel, the capacitive coupling between the control gate CG and the floating gate FG is used. Furthermore, in the write inhibiting state, Vpass is used, when the capacitive coupling between the control gate CG and floating gate FG is used to boost the channel potential. In the write inhibiting state, to prevent a defect that the data is wrongly written (wrong write defect), it is necessary to further boost the channel potential. On the other hand, when Vpass is increased to boost the potential of the channel, the wrong write defect is generated by Vpass itself. Especially, in the cell belonging to a NAND row in which the cell in a write state exists and the channel potential is low, the influence is severest. Therefore, it is most preferable to boost only the channel potential without boosting Vpass.

FIG. 15 shows a circuit diagram of the NAND-type EEPROM in which the cells according to the first and second embodiments are used. FIG. 16 shows one example of the potential in writing the data according to the present embodiment.

In the present embodiment, the NAND-type EEPROM is constituted by connecting the cell transistors which are adjacent memory cells MC, and the sources and drains of the selection gates ST1, ST2 in series to one another. Moreover, the floating gate FG is disposed between two control gates CG. That is, one floating gate FG shares two control gates CG, and two control gates CG select one floating gate FG.

As shown in FIGS. 16, 17, in the present embodiment, at the write time, for example, the same write voltage Vpgm is applied to two control gates CG disposed adjacent to one floating gate FG to set the substrate, for example, to 0 V. In this state, the electric charges are implanted in the floating gate FG from the substrate.

As described in the first embodiment, when the present invention is used, the capacitance ratio can be increased even with the miniaturization, and Vpgm can be reduced as compared with the related art. On the other hand, in the write inhibiting state, as shown in FIG. 3, in the present embodiment, the control gate CG is coupled not only to the floating gate FG but also to the diffused layer via the capacity Cip_ext. Accordingly, in the related art, the channel potential is boosted only by the capacitive coupling between the control gate CG and floating gate FG. On the other hand, according to the third embodiment, it is also possible to boost the channel potential with the capacitive couplings between the control gate CG and floating gate FG and between the control gate CG and diffused layer. Therefore, even when the same Vpass potential as that of the related art is used, it is possible to further boost the channel potential.

Therefore, according to the present embodiment, it is possible to boost the channel potential at the write inhibiting time without increasing the stress by Vpass itself.

FOURTH EMBODIMENT

In the second embodiment, the same voltage is supplied to two control gates CG to drive one floating gate FG. On the other hand, in a fourth embodiment, the supply of different potentials to two control gates CG will be described.

FIG. 18 shows that Vpgm is supplied to one control gate CG, and 0 V is supplied to the other control gate CG. The capacitance ratio of Cip to Ctox is assumed to be 1.5:1, and a neutral threshold voltage of the floating gate FG in which any electric charge is implanted, and the present threshold voltage are set to 0 V. In FIG. 17, the potential Vfg of the floating gate FG is as follows.

$$Vfg = Vpgm * 2 * Cip / (2 * Cip + Ctox)$$
$$= 0.75 * Vpgm$$

On the other hand, in FIG. 18, the potential Vfg of the floating gate FG is as follows.

$$Vfg = Vpgm * Cip / (2 * Cip + Ctox)$$
$$= 0.375 * Vpgm$$

When the potential of one of two control gates CG is changed in this manner, the capacitance ratio can be greatly controlled.

FIG. 19 shows an example of data write in which the above-described characteristics are used. In FIG. 19, Vpgm is applied to control gates CG4, CG5 on the opposite sides of the write cell. When the above assumption is used, a potential of 0.75*Vpgm is applied to a floating gate FG45. Moreover, 0 V is applied to a control gate CG3 disposed further adjacent to two control gates CG disposed adjacent to the write cell. Therefore, a potential of 0.375*Vpgm is applied to the floating gate FG34 disposed adjacent to the write cell. Therefore, an electric field stress onto the adjacent cell by the floating gate FG34 is ½ of that of the floating gate FG45, and the wrong write can be inhibited. A predetermined potential Vpass for transferring the potential or boosting the channel potential is applied to the control gate CG2 which is further apart from the cell. At an actual device operation time, in consideration of a write characteristic, channel boost characteristic, potential transfer characteristic, and the like, the potentials of the control gates CG are appropriately combined.

According to the fourth embodiment, when the potentials of two control gates CG disposed adjacent to one floating gate FG are appropriately combined, the write characteristic can be improved, and the wrong write can be avoided.

FIFTH EMBODIMENT

FIG. 20 shows a following equation, and shows a potential in erasing data. To erase the data, the substrate in which the cell transistor is disposed is boosted to an erase potential Vera. Additionally, for a contact and selection gates SGS, SGD, the potential is boosted to the same potential Vera as that of the substrate. Furthermore, a sufficiently low potential, for example, 0 V is supplied to the control gates CG1, 2 . . . disposed adjacent to the cell to be erased. Then, the electric charge is drawn toward the boosted substrate from the floating gate FG to erase the data.

It is to be noted that for the cell not to be erased, the control gate CG is floating. In this case, the potential of the control gate CG is boosted to the substrate potential by the capacitive coupling with the substrate, and the data is inhibited from being erased. In the present embodiment, the opposite side surfaces of all the cells in which the data is to be erased are surrounded with the control gate CG, and thereby the influences by the selection gates SGS, SGD are not generated.

Moreover, the selection gates SGS, SGD are preferably set to an appropriate gate dimension or structure so as to prevent an excessive electric field from being applied to the gate insulating film by the capacitive coupling between the control gates CG disposed adjacent to each other.

According to the fifth embodiment, in the memory including a cell structure in which the control gates CG are disposed on the opposite sides of the floating gate FG, the data can be securely erased.

SIXTH EMBODIMENT

FIGS. 21, 22 show a sixth embodiment, and a potential at the data write time. In FIG. 21, a read voltage Vwl is supplied to two control gates CG4, CG5 disposed adjacent to the floating gate FG45 of a read cell. The read voltage Vwl is preferably set to an appropriate potential in consideration of the write characteristic, data hold characteristic, operation range of the cell transistor threshold voltage, and the like. If the read voltage Vwl=0 V, and the assumption described in the fourth embodiment is used, a potential of 0 V is applied to the floating gate FG45 of the read cell.

On the other hand, a potential Vread for passing a cell current is applied to a control gate CG3 disposed further adjacent to two control gates CG disposed adjacent to the read cell. Vread is preferably set to an appropriate potential for determining the threshold voltage of the read cell, excluding the influence of the non-selected cell which is connected to the read cell.

In the present embodiment, only for the cell in which both the control gates CG disposed on the opposite side surfaces of the cell indicate the read voltage Vwl, the threshold voltage is determined. For the cell in which the potentials of two control gates CG have a combination other than described above, the threshold voltage is set so as to obtain an on state regardless of the stored data.

For the read of the NAND-type EEPROM, the cell transistor other than the selected cell described above has to be brought in the on state. To obtain a sufficient cell current, a sufficient electric charge needs to be supplied to the diffused layer. In the related art, the impurities are implanted into the diffused layer to supply the electric charges. However, the securing of the cell current and deterioration of the short channel effect by the diffusion of the impurities have gradually been closed up as conflicting problems caused by the miniaturization.

According to the first to sixth embodiments, the capacitive coupling Cip_ext exists between the control gate CG and diffused layer. Therefore, when the potential is supplied to the non-selected control gate CG, the reverse of the diffused layer under the control gate CG can be assisted. Therefore, only at the read time, it is possible to supply the electric charge only to a control range of the control gate CG.

FIG. 22 shows one example of the potential in using the above-described effect. The thickness of the insulating film formed between the control gate CG and substrate, and the potential of the non-selected control gate CG at the read time are set to satisfy the following condition. That is, an implantation amount of the impurities into the diffused layer is reduced to inhibit the short channel effect of the cell transistor from deteriorating. Moreover, an appropriate potential is applied to the control gate CG at the read time to obtain a desired cell current. The thickness and potential are preferably set so as to simultaneously satisfy these conditions.

The embodiments of the present invention as shown in FIGS. 1-22 have many different implementations. A few of these implementations are shown in FIGS. 27-33.

In one example, shown in FIG. 27, a memory card 60 includes the semiconductor memory device 50 constituted by the NAND type EEPROM as disclosed in each of the embodiments. As shown in FIG. 27, the memory card 60 is operable to receive/output predetermined signals and data from/to an external device (not shown).

A signal line (DAT), a command line enable signal line (CLE), an address line enable signal line (ALE) and a ready/busy signal line (R/B) are connected to the memory card 60 having the semiconductor memory device 50. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the semiconductor memory device 50 is ready, or not.

Another exemplary implementation is shown in FIG. 28. The memory card shown in FIG. 28 differs from the memory card presented in FIG. 27 in that the memory card 60 of FIG. 28 includes, in addition to the semiconductor memory device 50 constituted by the NAND type EEPROM, a controller 70 which controls the semiconductor memory device 50 and receives/transfers predetermined signals from/to an external device (not shown).

The controller 70 includes an interface unit (I/F) 71, 72, a microprocessor unit (MPU) 73, a buffer RAM 74 and an error correction code (ECC) unit 75. The interface unit (I/F) 71, 72 receives/outputs predetermined signals from/to an external device (not shown) and the semiconductor memory device 50, respectively. The microprocessor unit 73 converts a logical address into a physical address. The buffer RAM 74 stores data temporarily. The error correction code unit 75 generates an error correction code. A command signal line (CMD), a clock signal line (CLK) and a signal line (DAT) are connected to the memory card 60. It should be noted that the number of the control signal lines, bit width of the signal line (DAT) and a circuit construction of the controller 70 could be modified suitably.

Another exemplary implementation is shown in FIG. 29. As can be seen from FIG. 29, a memory cardholder 80 is provided for receiving a memory card 60 having a semiconductor memory device 50 constituted by the NAND type EEPROM as discussed in each the embodiments. The cardholder 80 is connected to an electronic device (not shown) and is operable as an interface between the card 60 and the electronic device. The cardholder 80 may perform one or more of the functions of the controller 70 described in connection with FIG. 28.

Another exemplary implementation will be explained with reference to FIG. 30. FIG. 30 shows a connecting apparatus operable to receive a memory card or a cardholder, either of which includes the semiconductor memory device constituted by the NAND type EEPROM. The memory card or cardholder is insertable in the connecting apparatus 90 and is electrically connectable to the apparatus. The connecting apparatus 90 is connected to a board 91 via a connecting wire 92 and an interface circuit 93. The board 91 contains a CPU (Central Processing Unit) 94 and a bus 95.

Another exemplary implementation is shown in FIG. 31. As shown in FIG. 31, a memory card 60 or a cardholder 80, either of which includes the semiconductor memory device constituted by the NAND type EEPROM, is inserted and electrically connectable to a connecting apparatus 90. The connecting apparatus 90 is connected to a PC (Personal Computer) 300 via connecting wire 92.

Another exemplary implementation is shown in FIGS. 32 and 33. As shown in FIGS. 32 and 33, a semiconductor memory device 50 constituted by the NAND type EEPROM as described in each of the embodiments and other circuits such as ROM (read only memory) 410, RAM (random access memory) 420 and CPU (central processing unit) 430 are included in an IC (interface circuit) card 500. The IC card 500 is connectable to an external device via a plane terminal 600 that is coupled to an MPU (micro-processing unit) portion 400 of the card 450. The CPU 430 contains a calculation section 431 and a control section 432, the control section 432 being coupled to the nonvolatile semiconductor memory device 50, the ROM 410 and the RAM 420. Preferably, the MPU 400 is molded on one surface of the card 500 and the plane connecting terminal 600 is formed on the other surface.

Other implementations are readily discernable to one of ordinary skill in the art when the present description is read in view of the description in U.S. Pat. No. 6,002,605, which is incorporated herein by reference.

FIG. 34 shows another embodiment to which the NAND type EEPROM according to each of the above-described embodiments is applied. As shown in FIG. 34, a universal serial bus (USB) memory system 142 is constituted by a host platform 144 and a USB memory device 146.

The host platform 144 is connected to the USB memory device 146 via a USB cable 148. The host platform 144 is connected to the USB cable 148 via a USB connector 150, and the USB memory device 146 is connected to the USB cable 148 via a USB connector 152. The host platform 144 includes a USB host controller 154 controls packet transmitted on a USB bus.

The USB memory device 146 includes a USB flash controller 156, the USB connector 152 and at least one flash memory module 158. The USB flash controller 156 controls the other elements of the USB memory device 146 and also controls an interface of the USB memory device 146 to the USB bus. The flash memory module 158 includes a semiconductor memory device constituted by the NAND type EEPROM according to each embodiment.

When the USB memory device 146 is connected to the host platform 144, a standard USB process starts. In this process, the host platform 144 recognizes the USB memory device 146 to select a communication mode with the USB memory device 146. Then, the host platform 144 transfers/receives data to/from the USB memory device via a first-in-first-out (FIFO) buffer which stores transmission data called an end point. The host platform 144 recognizes changes of physical and electrical states of the USB memory device 146, such as attachment/detachment, via another end point, and receives packets to be received if any.

The host platform 144 sends a request packet to the USB host controller 154 to request for a service from the USB memory device 146. The USB host controller 154 transmits the packet onto the USB cable 148. The USB memory device 146 includes the end point which has accepted this request packet. In this case, these requests are received by the USB flash controller 156.

Next, the USB flash controller 156 carries out various operations such as the read of data from the flash memory module 158, the write of the data into the flash memory module 158, and the erase of the data. Furthermore, the USB flash controller 156 supports basic USB functions such as obtaining an USB address. The USB flash controller 156 controls the flash memory module 158 via a control line 160 for controlling outputs of the flash memory module 158, and via various signals such as /CE or a read/write signal. The flash memory module 158 is also connected to the USB flash controller 156 via an address data bus 162. The address data bus 162 transfers commands of read, write, and erase with respect to the flash memory module 158, and the address and data of the flash memory module 158.

The USB memory device 146 transmits a state packet using a state end point (end point 0) in order to inform the host platform 144 of results and states with respect to various operations which have requested by the host platform 144. In this process, the host platform 144 checks if there is any state packet (poling), and the USB memory device 146 returns an empty packet or the state packet itself, when there is not a packet of a new state message. It is to be noted that the USB cable 148 may be omitted, and a USB connector may also be used to directly connect the USB memory device 146 to the host platform 144. Additionally, various functions of the USB memory device can be carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A nonvolatile semiconductor memory device comprising:
    a cell transistor comprising a floating gate formed on a semiconductor substrate via a gate insulating film and diffusion layers as source and drain regions, the diffusion layers being positioned on opposite sides of the floating gate and formed in the semiconductor substrate;
    first and second control gates which are formed above the diffusion layers and only on the opposite sides of the floating gate; and
    an inter-gate insulating film which insulates the first and second control gates from the floating gate and diffusion layers,
    wherein the inter-gate insulating film includes first and second portions,
    the first portion contacts the floating gate,
    the second portion contacts the lower surface of the first or second control gate,
    the second portion is a single layer of a silicon oxide film,
    the first portion is a stacked film including a silicon nitride film, and
    the floating gate is selected by the first and second control gates.

2. A nonvolatile semiconductor memory device comprising:
    cell transistors, each of which comprises a floating gate formed on a semiconductor substrate via a gate insulating film and in which adjacent sources and drains are connected in series;
    control gates which are formed above the diffusion layers and only on the opposite sides of the floating gate; p1 an inter-gate insulating film which insulates the first and second control gates from the floating gate and diffusion layers, wherein the inter-gate insulating film includes first and second portions, the first portion contacts the floating gate, the second portion contacts the lower surface of the first or second control gate, the first portion is a stacked film including a silicon nitride film, and the second portion is a single layer of a silicon oxide film;
    a first selection gate connected between one end of the cell transistors and bit line; and
    a second selection gate connected between the other end of the cell transistors and source line,
    wherein the control gates on the opposite sides of the floating gate select the floating gate.

3. The device according to claim 2, wherein the floating gate is selected by two adjacent control gates.

4. A memory card including the nonvolatile semiconductor memory device recited in claim 1.

5. A cardholder to which the memory card recited in claim 4 is inserted.

6. A connecting device to which the memory card recited in claim 5 is inserted.

7. The connecting device according to the claim 6, wherein the connecting device is configured to be connected to a computer.

8. A memory card including the nonvolatile semiconductor memory device recited in claim 1 and a controller which controls the nonvolatile semiconductor memory device.

9. A cardholder to which the memory card recited in claim 8 is inserted.

10. A connecting device to which the memory card recited in claim 8 is inserted.

11. The connecting device according to the claim 10, wherein the connecting device is configured to be connected to a computer.

12. An IC card including the nonvolatile semiconductor memory device recited in claim 1.

13. The IC card including a controller which controls the nonvolatile semiconductor memory device recited in claim 1.

14. A USB memory system according to claim 1, comprising:
    a USB memory device having the nonvolatile semiconductor memory device recited in claim 1,
    a first controller which controls the nonvolatile semiconductor memory device; and
    a first connector connected to the first controller.

15. The USB memory system according to claim 14, further comprising:
    a host platform including a second connector which is connected to the first connector of the USB memory device, and a controller connected to the second connector, which controls the USB memory system.

* * * * *